United States Patent
Tricard et al.

(10) Patent No.: US 6,800,018 B2
(45) Date of Patent: Oct. 5, 2004

(54) CUTTING DEVICE FOR SEPARATING INDIVIDUAL LAMINATED CHIP ASSEMBLIES FROM A STRIP THEREOF, METHOD OF SEPARATION AND A METHOD OF MAKING THE CUTTING DEVICE

(75) Inventors: Marc J. M. Tricard, Fairport, NY (US); Robert J. Fisher, Maple Shade, NJ (US); Robert F. Corcoran, Jr., Oakham, MA (US)

(73) Assignee: Saint-Gobain Abrasives Technology Company, Worcester, MA (US)

( * ) Notice: Subject to any disclaimer, the term of this patent is extended or adjusted under 35 U.S.C. 154(b) by 0 days.

(21) Appl. No.: 10/074,331

(22) Filed: Feb. 12, 2002

(65) Prior Publication Data

US 2003/0153247 A1 Aug. 14, 2003

(51) Int. Cl.⁷ ............................................... B24B 1/00
(52) U.S. Cl. ........................... 451/28; 451/547; 125/15
(58) Field of Search .......................... 451/28, 541, 547; 125/15, 13.01, 39; 51/298, 293

(56) References Cited

U.S. PATENT DOCUMENTS

| | | | |
|---|---|---|---|
| 3,650,715 A | 3/1972 | Brushek et al. | 51/298 |
| 4,142,870 A | 3/1979 | Lovejoy | 51/298 |
| 5,313,742 A | 5/1994 | Corcoran, Jr. et al. | 51/206 |
| 6,056,795 A | 5/2000 | Ramanath et al. | 51/309 |
| 6,176,966 B1 | 1/2001 | Tsujimoto et al. | 156/344 |
| 6,208,020 B1 | 3/2001 | Minamio et al. | 257/684 |
| 6,271,102 B1 | 8/2001 | Brouillette et al. | 438/462 |
| 6,276,355 B1 | 8/2001 | Zhang et al. | 125/20 |

FOREIGN PATENT DOCUMENTS

| | | | | |
|---|---|---|---|---|
| GB | 1396332 | 6/1975 | | C08L/77/10 |
| JP | 2001-53033 | 2/2001 | | H01L/21/78 |
| JP | 2001-77129 | 3/2001 | | H01L/21/50 |

Primary Examiner—Robert A. Rose
(74) Attorney, Agent, or Firm—Mary E. Porter

(57) ABSTRACT

An abrasive wheel is used to separate individual laminated chips from a strip by cutting through the copper bridging elements. The abrasive wheel is made up of abrasive particles bonded in a matrix having a high glass transition temperature and a cutting edge having a maximum thickness of the order of 350 micron, whereby the cut is substantially straight and free of smears and burrs.

17 Claims, 4 Drawing Sheets

US 6,800,018 B2

CUTTING DEVICE FOR SEPARATING INDIVIDUAL LAMINATED CHIP ASSEMBLIES FROM A STRIP THEREOF, METHOD OF SEPARATION AND A METHOD OF MAKING THE CUTTING DEVICE

FIELD OF THE INVENTION

The invention relates to a cutting device for separating individual laminated chip assemblies from a strip of such assemblies, method of separation and a method of making the cutting device. More particularly the invention relates to cutting devices of the type used for cutting, dicing, slicing, and singulating of components used by the electronics industry.

BACKGROUND OF THE INVENTION

There is a need for a cutting device for use in the electronics industry. Examples of such cutting operations are the dicing, slicing, and singulating which are involved in the manufacture or processing of silicon wafers and so-call pucks made of an alumina-titanium carbide composite, for the electronics industry in general and the computer industry in particular. As is well known, silicon wafers are processed for integrated circuits while alumina-titanium carbide pucks are utilized to fabricate flying thin film heads for writing (recording) and reading (playing back) information magnetically stored in computers.

Integrated circuits are typically assembled into a package which is mounted on a printed circuit board. There are many types of integrated circuit packages including quad flat pack (QFP), ceramic pin grid array (PGA) and ball grid array (BGA) and quad flat no lead (QFN) packages.

QFP packages contain a metal lead frame which has a plurality of individual leads which extend from a center die paddle. The die paddle supports the integrated circuit. The integrated circuit has a number of bond pads that are wire bonded to the individual leads. The integrated circuit and a portion of the lead frame are encapsulated in an injection molded plastic housing.

PGA packages have a plurality of pins that extend from a housing which encloses an integrated circuit. The pins of the package are mounted to an external printed circuit board. PGA package housings are typically constructed from a ceramic material, or a plastic/printed circuit boards, which create relatively high pin densities.

BGA packages have a plurality of solder balls that are attached to a substrate. The substrate may be constructed from ceramic or printed circuit boards. BGA chips are used in non-memory devices such as processors and flash memory units.

QFN packages comprise a printed circuit on a relatively thick conductive layer, typically copper, and are useful in memory applications. In the context we refer to Japanese patent publications JP-2001-53033 and JP-2001-77129.

Laminates of soft materials such as copper cannot easily be sliced cleanly without smearing and creating burrs along the edges of the chips. Such irregularities will interfere with the electrical contacts to the chip because the copper forms the chip connectors. If the chip connector is not of the right form then it must be rejected which drives up the rejection rate and accordingly the manufacturing costs. A QFN assembly has a thick copper layer for improved thermal conductivity and it is the most difficult category of chip assemblies to slice cleanly.

It has been realised that abrasive wheels may be used as cutting tools in the electronics industry. The use of abrasive wheels to cut silicon wafers and alumina-titanium carbide pucks is explained in U.S. Pat. No. 5,313,742, the entire disclosure of which patent is incorporated herein by reference. Ideally, cutting blades to effect such cuts should be as stiff as possible and as thin and flat as practical because the thinner and flatter the blade, the less kerf waste produced and the stiffer the blade, the more straight it will cut. However, these characteristics are in conflict because the thinner the blade, the less rigid it becomes.

Cutting blades are made up basically of abrasive grains and a bond which holds the abrasive grains in the desired shape.

It is known to use monolithic abrasive wheels, usually ganged together on an arbor. Individual wheels in the gang are axially separated from each other by spacers. Traditionally, the individual wheels have a uniform axial dimension from the wheel's arbor hole to its periphery. Although quite thin, the axial dimension of these wheels is greater than desired to provide adequate stiffness for good accuracy of cut. However, to keep waste generation within acceptable bounds, the thickness is reduced. This diminishes rigidity of the wheel to less than the ideal.

It is an object of this invention to provide a cutting tool useful in separating laminated chip assemblies, especially for QFN assemblies having a relatively thick copper layer, i.e., 200–400 microns thick. A typical QFN assembly is 1200 microns thick, of which the copper layer is 220 microns thick.

It is another object of this invention to provide methods of separating a laminated chip assemblies, especially those having a relatively thick copper layer.

It is another object of the invention to provide a method of making a cutting tool for use in the method.

SUMMARY OF THE INVENTION

According to the invention in one aspect there is provided an abrasive wheel for use in separating one quad flat, no-lead, integrated circuit package from another by cutting through a bridging element which joins them, each package comprising a printed circuit board in a protective body therefor, the abrasive wheel comprising a disc formed of abrasive material comprising abrasive particles bonded in a matrix comprising cured polyimide resin and metal particles, the disc forming a cutting edge having a maximum thickness of the order of 350 micron, whereby the cut is substantially straight and is substantially free of smears and burrs.

According to the invention in another aspect there is provided cutting apparatus for use in separating one quad flat, no-lead, integrated circuit package from another by cutting through a bridging element which joins them, the apparatus comprising a plurality of abrasive wheels, each wheel comprising a disc formed of abrasive material comprising abrasive particles bonded in a matrix comprising cured polyimide resin and metal particles, the disc forming a cutting edge having a maximum thickness of the order of 350 micron, the wheels being mounted in parallel on a common shaft, whereby cuts in parallel bridging elements may be made when the shaft is rotated.

According to the invention in yet another aspect there is provided a method of separating one quad flat, no-lead, integrated circuit package from another by cutting through a metal bridge elements joining adjacent packages, each package comprising a printed circuit board in a protective body therefor, the method comprising rotating an abrasive wheel to cut through a bridge element, the wheel having a maximum cutting edge having a thickness of the order of 350 micron and formed of bonded abrasive particles in a matrix comprising cured polyimide resin, and metal particles, whereby the cut is substantially straight and little or no smears or burrs are formed on the cut surface.

According to the invention in yet another aspect there is provided a method of separating one quad flat, no-lead, integrated circuit package from another by cutting through a metal bridge element by which one package is joined to the other, each package comprising a printed circuit body in a protective body, the method comprising rotating an abrasive wheel having a cutting edge to cut through the bridging element, the edge having a maximum thickness of the order of 350 micron and being formed of abrasive particles held in a matrix of a hardened resin including metal particles and having a high glass transition temperature, whereby the cut is substantially straight and the cut surface is substantially free of smears and burrs.

According to the invention in yet another aspect there is provided a method of making an abrasive wheel having a cutting edge adapted to cut through a bridging element joining two integrated circuit packages and to leave a substantially straight cut substantially free of smears and burrs, the method comprising subjecting to temperature and pressure a composition comprising abrasive particles, metal particles and of a polyimide resin to cause the formation of a matrix having a high glass transition temperature containing the abrasive particles and the metal particles to weld together within the matrix, in a mould shaped to form an annulus defining a cutting edge having a maximum thickness of the order of 350 micron.

Figure 1:
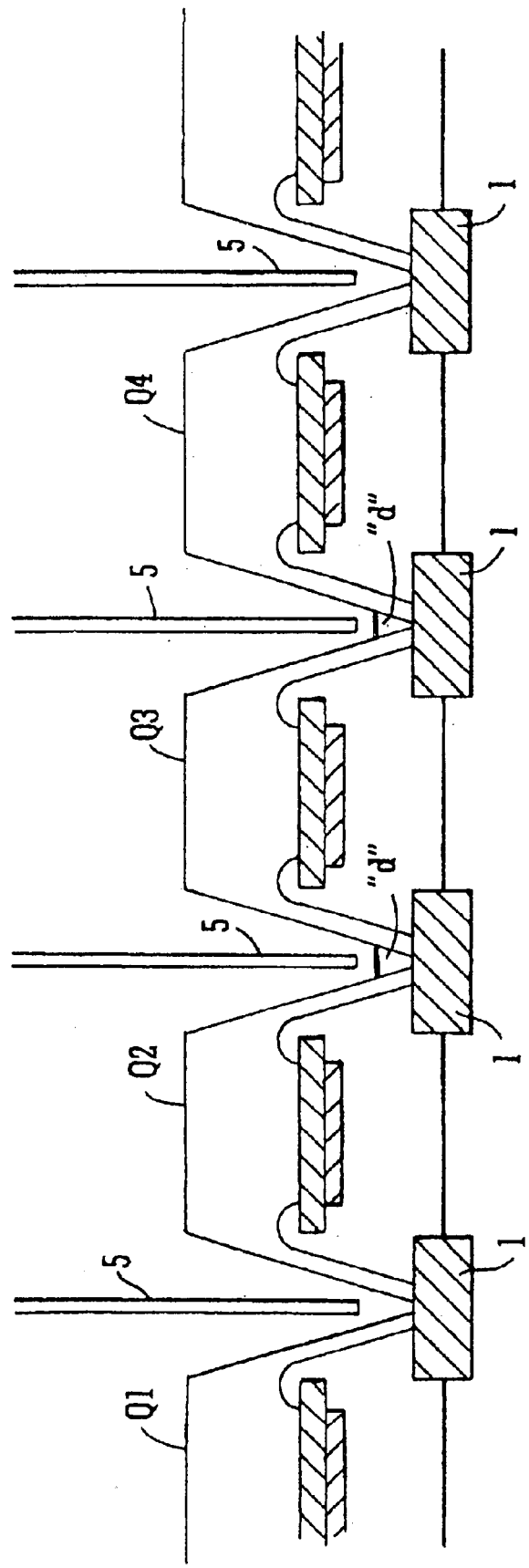
FIG. 1 is a side elevation of a row of QFN packages to be singulated showing a cutting tool of the invention, parts being shown in section.
Figure 2:
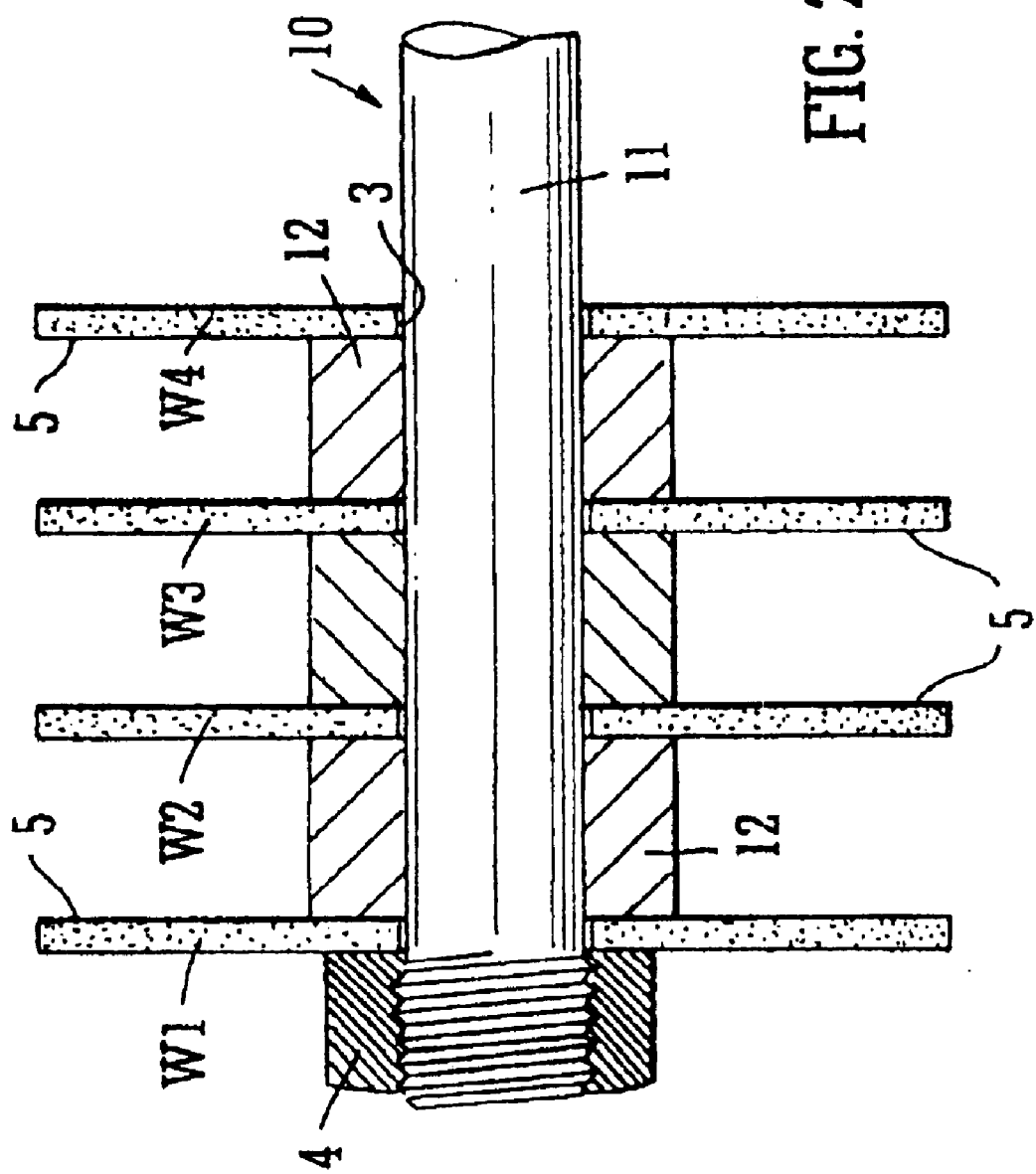
FIG. 2 is a longitudinal section of one cutting apparatus of the invention.

The cutting device is an abrasive wheel which comprises particles of abrasive material. A primary consideration for selecting the abrasive grain is that the abrasive substance should be harder than the material to be cut. Usually the abrasive grains of thin abrasive wheels will be selected from very hard substances because these wheels are typically used to abrade extremely hard materials such as alumina-titanium carbide. Representative hard abrasive substances for use in this invention are so-called superabrasives such as diamond and cubic boron nitride, and other hard abrasives such as silicon carbide, fused aluminum oxide, microcrystalline alumina, silicon nitride, boron carbide and tungsten carbide. Mixtures of at least two of these abrasives can also be used. Diamond is preferred.

The particle size of the abrasive grains should be in the range of about 44 to about 126 micron, and more preferably, about 75 to about 126 micron. Typical diamond abrasive grains suitable for use in this invention have particle size distributions of 150 grit (−140/+170 U.S. mesh).

The matrix is comprised of a cured polyimide resin or other resin having similar properties. The polyimides are preferably powders of aromatic polyimides. Preferred are those formed of by reaction of 4,4'-oxyaniline and 3,3',4,4'-benzophenone tetracarbonylic anhydride. A preferred ratio of the reactants is 115 mole parts of the aniline to 100 parts of the anhydride. Such a matrix when hardened will have a high glass transition temperature value. In the context we refer to U.S. Pat. Nos. 3,650,715 and 4,142,870, the entire disclosures of which is to be incorporated by reference herein.

Preferably the matrix includes metal particles which are welded together in the matrix in the formation of the wheel. Preferably the metal particles are of copper or tin or both. Other suitable metals are nickel, cobalt, iron, zinc, antimony, chromium and indium. Preferably the particles are dendritic or platelet shaped.

The abrasive wheel comprises 5 to 40 vol. % abrasive particles, 10 to 50 vol. %, preferably 25 to 40 vol. %, metal particles, and 20 to 50 vol. %, preferably 30 to 45 vol. %, resin. The contents of abrasive particles, resin and metal filler are selected so as to add up to 100%, by volume of the wheel (or disc). A preferred abrasive wheel comprises 32.7 volume % metal particles, 36.1 volume % resin and 31.2 volume % abrasive grain.

Other substances may be present, provided that they do not interfere with the operation of the cutting device. For example, organic compounds may be present to aid in mixing and moulding.

The abrasive wheel can be basically produced by a curing process of the so-called "cold press" or "hot press" types. In a cold press process, a blend of the components is introduced into a mold of desired shape and a high pressure is applied at room temperature to obtain a compact but friable molded article. Usually the high pressure is above about 5 tons/sq.inch. Subsequently, pressure is relieved and the molded article is removed from the mold then heated to curing temperature. The heating for curing normally is done while the molded article is pressurized to a lower pressure than the pre-curing step pressure, i.e., less than about 100 MPa, and preferably less than about 50 MPa. During this low pressure curing, the molded article, a thin abrasive wheel, advantageously can be placed in a mold and/or sandwiched between flat plates with sufficient pressure to maintain flatness.

In a hot press process, the blend of particulate bond composition components is put in the mold, typically of steel, heated, and compressed to high pressure as in the cold process. However, the high pressure is maintained at curing temperature, thereby achieving densification while the preform is under pressure.

An initial step of the abrasive wheel process involves packing the components into a shape forming mold. The components can be added as a uniform blend of separate abrasive grains, metal component constituent particles and stiffness enhancing metal component constituent particles. This uniform blend can be formed by using any suitable mechanical blending apparatus known in the art to blend a mixture of the grains and particles in preselected proportion. Illustrative mixing equipment can include double cone tumblers, twin-shell V-shaped tumblers, ribbon blenders, horizontal drum tumblers, and stationary shell/internal screw mixers.

Once the uniform blend is prepared, it is charged into a suitable mold. In a preferred hot press process, the mold contents can be compressed with externally applied mechanical pressure at 400–500° C. temperature to about 345–690 MPa. A platen press can be used for this operation. After the mold contents reach pressing temperature, compression is maintained for about 10–20 minutes, the mold and mold contents are cooled, after which pressure is relieved and the preform is heated to curing temperature.

The preferred abrasive tool according to this invention is a Type 1A8 abrasive wheel. Accordingly, the typical mould shape is that of a thin disk. The moulds are usually stacked in a vertical pile separated by a steel plate between adjacent disks. A solid disk mould can be used, in which case after curing a central disk portion can be removed to form the arbor hole. Alternatively, an annular shaped mould can be used to form the arbor hole in situ. The latter technique avoids waste due to discarding the abrasive-laden central portion of the cured disk. The products are finished by conventional methods such as precision grinding to obtain dimensional tolerances of ±12.7 microns, preferable 2.5 microns in thickness.

DETAILED DESCRIPTION OF THE DRAWINGS

As shown in the drawings, a strip or line of QFN packages Q1, Q2, Q3, Q4, etc. is held together by copper bridging elements 1. The bridging elements are typically 200 to 400 micron thick. The packages have been processed in known manner by steps such as wafer dicing, die bonding, wire bonding, plastics moulding, solder bumping and are ready for singulation by a method of the invention. Each package consists of a sandwich construction of copper sheet on a resin moulded compound. The packages may be etched or unetched. While it is relatively easy to slice an etched package because the content of copper is very low, it is more difficult to slice an unetched package. This invention is capable of slicing both types of packages with ease. As shown, the QFN package consists of a sandwich construction of copper sheet on to a resin moulding compound. The moulding compound has copper leads buried in it which get sliced along with the moulding compound and copper substrate during the singulation process. The copper leads are very close to each other and any smearing of the copper along the direction of cut could potentially lead to electrical shorting of one lead with an adjacent one. Similarly, burring of the copper lead, which is really plastic deformation of copper in a perpendicular direction to the smear, could lead to shorts.

The packages are close together and the distance "d" between adjacent packages to be singulated typically measures 350 micron. It is therefore imperative that the cut into the elements be parallel and true to avoid smearing and burring.

The cutting tool 10 comprises a line of abrasive wheels W1, W2, W3, W4, mounted on a common rotary shaft 11. A spacer 12 is present between neighbouring wheels about the bore 3. A nut 4 is present at each end of the shaft 1 to hold the wheels together. Each wheel has a straight cutting edge 5 which measures less than 350 microns thick, preferably about 300 micron thick.

In use, the cutting tool is brought to the strip of chips with each wheel aligned with the bridging element. Because the wheels have a cutting edge 300 micron thick they can enter the distance "d" between neighbouring packages. The shaft 10 is rotated at a speed of 14000 sfpm and moved forward at about 30 mm/sec. The wheels cut cleanly, leaving generally parallel vertical walls, with little or no smears or burrs.

In order that the invention may be well understood it will now be described by way of illustration with reference to the following example:

EXAMPLE I

An abrasive wheel having an outer diameter of 3 inches (7.62 cm) and an inner diameter of 1.57 inches (3.98 cm) was made in a mold from the following composition under high temperature and pressure to cause the polyimide resin to form at a high glass transition temperature and to weld the copper particles into a discrete phase well bonded with the hardened resin. The mold was round and made of steel, and comprised outer die plates, and had a centre pin for the bore of the wheel.

| Ingredient | Content g |
|---|---|
| diamond particles RVGW S60 (60 weight % of nickel metal (coating) (GE Superabrasives, Worthington, Ohio, USA) mesh −140/+170 | 2.41 |
| uncured polyimide resin formed by reaction of 4, 4¹-oxydianiline and 3, 3¹, 4, 4¹ benzophenone tetracarboxylic dianhydride (G.P. Resin DuPont, Wilmington, Delaware, USA) | 0.74 |
| dendritic copper | 4.28 |
| TOTAL | 7.43 |

The oxygen was evacuated and the mould was heated to 400° C. and kept at 405–415° C. under a 15 tonne load for a period of about 20 minutes to form an abrasive wheel 3 inch (7.62 cm) in diameter and having a 40 mm bore. The wheel was 300 micron thick and had parallel sides after finishing.

The wheel was finished to provide a cutting blade having a thickness of 300 micron (±2.5 micron). The wheels were mounted on a rotary shaft or arbor to form a cutting assembly for singulating QFN packages.

The wheel was used to singulate, i.e. slice individual chips from a laminated chip assembly of the quad flat no lead ("QFN") type.

EXAMPLE II

An abrasive wheel according to Example I was used in a singulation test. The wheel was 7.62 cm outside diameter, 300 microns thick and about 40 mm inside diameter. The wheel was rotated at a spindle speed of 18000 rpm and was used to cut an etched QFN strip which was taped on a vacuum chuck. The feed rate was 75 mm/s. Thirty strips made of 5 arrays each were cut in the test. The quality was excellent, burring and smearing were minimal. Chipping did not occur.

EXAMPLE III

In an evaluation, the following results were obtained at the indicated feed rate and spindle speeds.

| Feedrate (mm/s) | Spindle speed (RPM) | Burr length (micron) |
|---|---|---|
| 10 | 18,000 | 32.6 |
| 10 | 20,000 | 25.7 |
| 30 | 18,000 | 27.2 |

The wheel radial wear on the wheel is shown below:

| Feedrate (mm/s) | Spindle speed (1000 RPM) | Wear (mm) |
| --- | --- | --- |
| 10 | 18 | 0.000 |
| 10 | 22 | 0.010 |
| 30 | 18 | 0.010 |
| 30 | 22 | 0.007 |

It will be seen from these results that with higher spindle speed and cutting rate better results are obtained.

Figure 3:
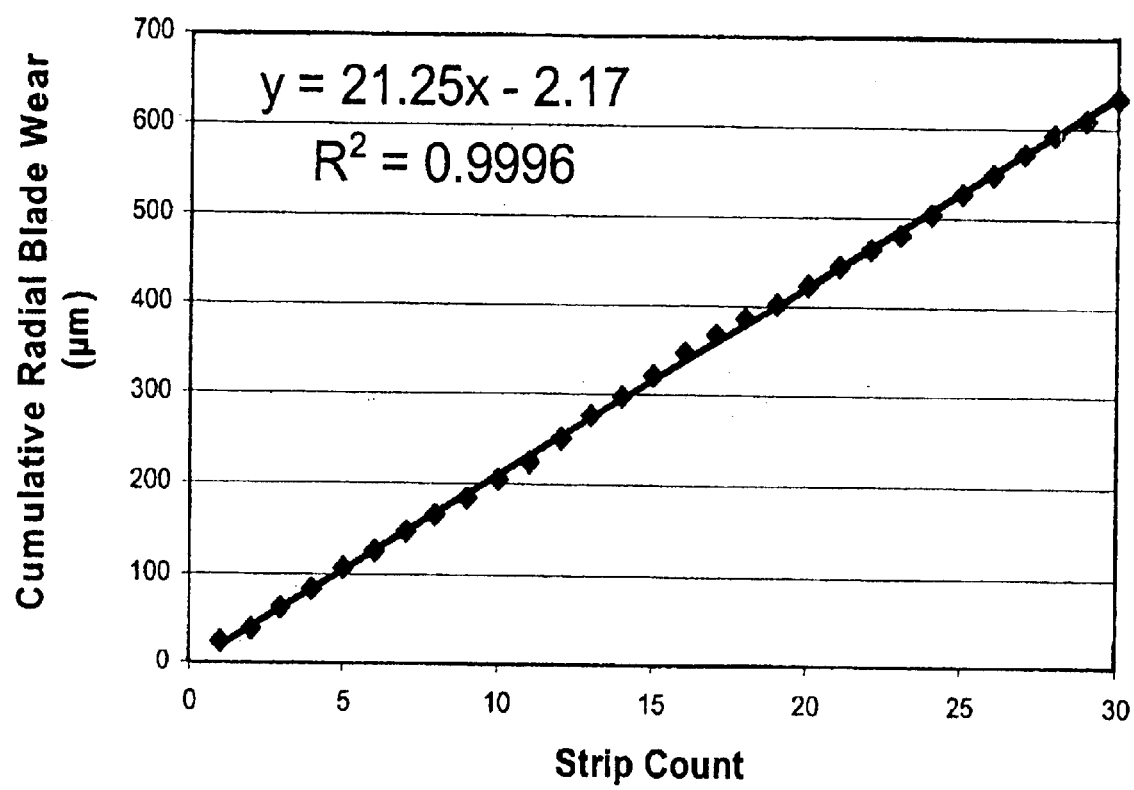
FIG. 3 is a graph plotting cumulative radial blade wear against strip count.
Figure 4:
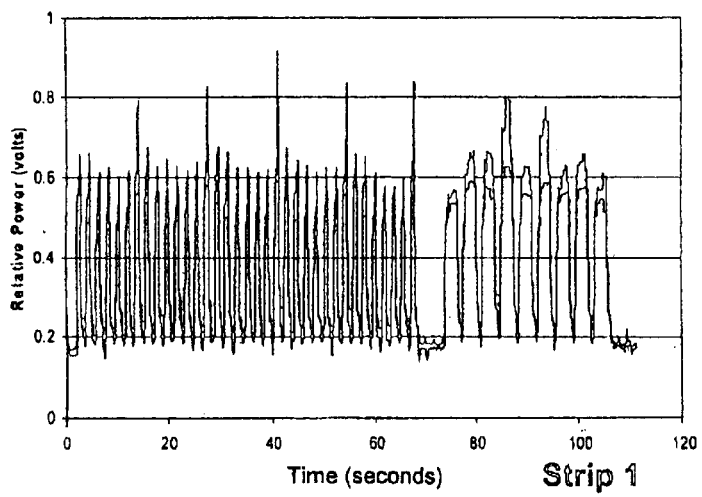
FIG. 4 is a graph plotting relative power against cutting time.
Figure 4:
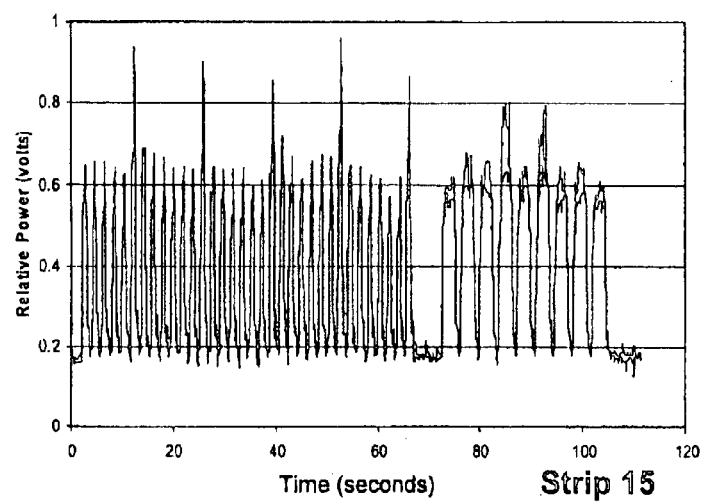
Figure 4:
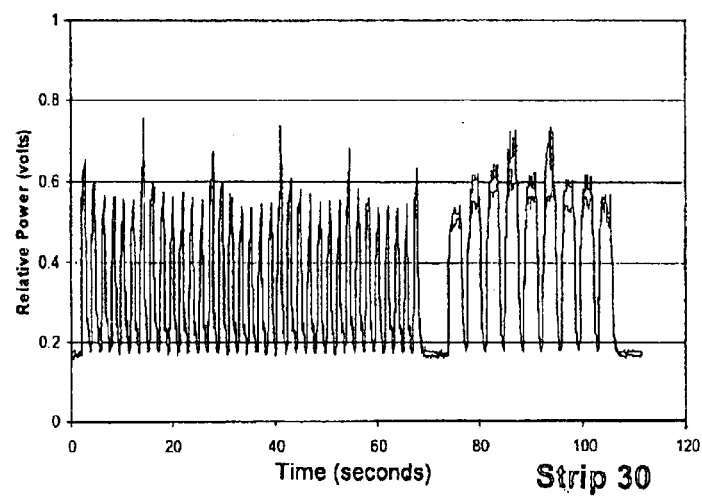

The results are shown graphically in FIGS. 3 and 4. The graph of FIG. 3 shows the cumulative radial blade wear, and because the cure is a straight line it will be seen that the wear is uniform and consistent. The graph of FIG. 4 shows a plot of the power against time, and that the values are substantially uniform, indicating that the wheels are self-dressing.

What is claimed is:

1. An abrasive wheel for use in separating one quad flat, no-lead, integrated circuit package from another by cutting through a bridging element which joins them, each package comprising a printed circuit board in a protective body therefor, the abrasive wheel comprising a disc formed of abrasive material comprising abrasive particles bonded in a matrix comprising cured polyimide resin, and metal particles, wherein the metal particles have been welded together, the disc forming a cutting edge having a maximum thickness of the order of 350 micron, whereby the cut is substantially straight and is substantially free of smears and burrs.

2. An abrasive wheel according to claim 1, wherein the disc has a thickness of 300 microns ±12.7 microns.

3. An abrasive wheel for use in separating one quad flat, no-lead, integrated circuit package from another by cutting through a bridging element which joins them, each package comprising a printed circuit board in a protective body therefor, the abrasive wheel comprising a disc formed of abrasive material comprising abrasive particles bonded in a matrix comprising cured polyimide resin, wherein the resin is formed by the reaction of 4,4'-oxydianiline and 3,3',4,4'-benzophenonetetracarboxylic dianhydride, and metal particles, the disc forming a cutting edge having a maximum thickness of the order of 350 micron, whereby the cut is substantially straight and is substantially free of smears and burrs.

4. An abrasive wheel according to claim 1, wherein the metal particles are selected from one or more of copper, tin, nickel, cobalt, iron, zinc, indium, antimony and chromium.

5. An abrasive wheel according to claim 1, wherein the abrasive particles are natural or synthetic diamond or CBN.

6. An abrasive wheel according to claim 1, wherein the wheel comprises a disc having a central hole for mounting on a rotary shaft.

7. Cutting apparatus for use in separating one quad flat, no-lead, integrated circuit package from another by culling through a bridging element which joins them, the apparatus comprising a plurality of abrasive wheels, each wheel comprising a disc formed of abrasive material comprising abrasive particles bonded in a matrix comprising cured polyimide resin and metal particles, wherein the metal particles have been welded together, the disc forming a culling edge having a maximum thickness of the order of 350 micron, the wheels being mounted in parallel on a common shaft, whereby cuts in parallel bridging elements may be made when the shaft is rotated, and whereby the cut is substantially straight and is substantially free of smears and burrs.

8. A method of separating one quad flat, no-lead, integrated circuit package from another by culling through a metal bridge elements joining adjacent packages, each package comprising a printed circuit board in a protective body therefor, the method comprising rotating an abrasive wheel to cut through a bridge element, the wheel having a cutting edge having a maximum thickness of the order of 350 micron and formed of bonded abrasive particles in a matrix comprising cured polyimide resin, wherein the resin is formed by the reaction of 4,4'-oxydianiline and 3,3',4,4'-benzophenone tetracarboxylic dianhydride, and metal particles, whereby the cut is substantially straight and little or no smears or burrs are formed on the cut surface.

9. A method of separating one quad flat, no-lead, integrated circuit package from another by cutting through a metal bridge elements joining adjacent packages, each package comprising a printed circuit board in a protective body therefor, the method comprising rotating an abrasive wheel to cut through a bridge element, the wheel having a cutting edge having a maximum thickness of the order of 350 micron and formed of bonded abrasive particles in a matrix comprising cured polyimide resin and metal particles, wherein the metal particles are welded together in the matrix, and whereby the cut is substantially straight and little or no smears or burrs are formed on the cut surface.

10. A method according to claim 9, the metal particles are selected from the group of copper, tin, nickel, cobalt, iron, zinc, chromium, antimony, indium, aluminum and titanium.

11. A method according to claim 8, wherein the wheel is rotated at about 11,000 to about 17,300 rpm surface feet/minute.

12. A method according to claim 11, wherein the wheel is rotated at 15,708 rpm surface feet/minute.

13. A method according to claim 11, wherein the wheel is rotated at about 14,137 surface feet/minute and a feed rate of from about 18 to about 30 mm/s.

14. A method of making an abrasive wheel having a cutting edge adapted to cut through a bridging element joining two integrated circuit packages and to leave a substantially straight cut substantially free of smears and burrs, the method comprising subjecting to temperature and pressure a composition comprising abrasive particles, metal particles and of a polyimide resin to cause the formation of a matrix having a high glass transition temperature containing the abrasive particles and the metal particles to weld together within the matrix, in a mould shaped to form an annulus defining a cutting edge having a maximum thickness of the order of 350 micron.

15. A method according to claim 14, wherein the resin is formed by the reaction of 4,4'-oxydianiline and 3,3',4,4'-benzophenone tetracarboxylic dianhydride.

16. A method according to claim 14, wherein the metal particles are selected from the group of copper, tin, nickel, cobalt, iron, zinc, chromium, antimony, indium, aluminum and titanium.

17. A method according to claim 14, wherein the abrasive particles are natural or synthetic diamond or CBN.

* * * * *